(12) United States Patent
Ho et al.

(10) Patent No.: US 6,711,025 B2
(45) Date of Patent: Mar. 23, 2004

(54) COMBINATION DEVICE OF THE IC CONNECTION DEVICE AND THE MAIN BOARD

(75) Inventors: Kwun-Yao Ho, Taipei (TW); Kung Moriss, Taipei (TW)

(73) Assignee: Via Technologies Inc. (TW)

( * ) Notice: Subject to any disclaimer, the term of this patent is extended or adjusted under 35 U.S.C. 154(b) by 0 days.

(21) Appl. No.: 10/200,909

(22) Filed: Jul. 23, 2002

(65) Prior Publication Data

US 2003/0112612 A1 Jun. 19, 2003

(51) Int. Cl.[7] .................................................. H05K 1/18
(52) U.S. Cl. ........................ 361/764; 361/785; 361/777; 361/803; 361/820; 257/713
(58) Field of Search ................................. 361/764, 785, 361/791, 792, 795, 803, 820, 718, 720, 760, 777; 257/713

(56) References Cited

U.S. PATENT DOCUMENTS 3,971,610 A * 7/1976 Buchoff et al. ............... 439/75
4,908,696 A * 3/1990 Ishihara et al. ............. 257/713
5,932,891 A * 8/1999 Higashi et al. ............... 257/48
6,414,248 B1 * 7/2002 Sundstrom ................. 174/260

* cited by examiner

Primary Examiner—Randy Gibson
Assistant Examiner—Hung Bui

(57) ABSTRACT

A combination device of the IC package connection device and the main board comprises a socket and a main board. The socket has a holding assembly which is placed on the top surface of the socket. The holding assembly connects to the external IC package electrically and the socket has a plurality of solder balls. The solder balls are placed on the bottom surface of the socket and connect to the holding assembly electrically. The socket is stable on the top surface of the main board and connects to the main board electrically. The positions of a plurality of PTHs in the main board are corresponding to the plurality of solder balls. The totally melting temperature of the solder balls is higher than that in prior art in order to make the solder balls be in controllable semi-solid state in solder reflow step. And a part of the solder ball will flow into a part of the PTH in order to form the mushroom-shape structure having an upper-mushroom part on the top surface of the main board and a lower-mushroom part flowing into the part of the PTH.

10 Claims, 7 Drawing Sheets

COMBINATION DEVICE OF THE IC CONNECTION DEVICE AND THE MAIN BOARD

BACKGROUND OF THE INVENTION (a) Field of the Invention

The present invention relates to the combination device of the IC connection device and the main board. Especially, the present invention relates to a main board which is suitable to combine one of the pin-style socket and the ball-style socket.

(b) Description of the Prior Arts

For long time in prior art, there are two basic methods to place IC package on main board. One is to solder firmly the IC package on the main board but the IC package is not replaceable. The other method is that the IC package is replaceable, so the IC package can be replaced when necessary. Most of time, the replaceable combination device of the IC connection device and the main board is used when the IC device needs to be upgraded, the IC device itself needs to be replaced or in some cases that need expensive IC device. The replaceable IC device is used when one of the devices on main board is broken or needs to be replaced but the rest of the components on the board still in good condition, the combination device of the main board and the socket of the CPU is a best example.

Please refer to FIG. 1 and FIG. 2, which showing a conventional replaceable combination device 10 of the main board and the socket of IC device in prior art. In prior art, an IC device 11 has pins 111, and the main board 12 has a socket 13 with many pin holes 131 in order to connect each other in better electrical condition. There are two basic methods to seal down the IC device 11, one is called lead frame and the other is BGA. In recent years, another method called flip chip BGA packaging has been used more often in sealing high-numbered pins IC package. FIG. 1 shows the basic components which comprising an IC chip 112 placed on one side of the substrate 113 by flip chip method. Several solder balls 114 are placed on the other side of the substrate 113, which connecting the IC chip 112 and the substrate 113. The other side of the IC chip 112 has a heat sink 115. For the pins 111 is not hard enough, and it is easy to be broken during replacing. And for the pins 111 is not easy to connect the solder 114 firmly. So, before being soldered to the solder ball 114, it has to be placed on an interposer 116 with modeling technology.

In order to provide the function, the pins 111 of the IC device 11 will be placed. The socket 13 in prior art comprises a socket base 132 with a plurality of holes 131 soldered on the main board 12, a sliding board 133 which can slide linearly and a long levering bar 134 placed aside the socket base 132 to be used to move the sliding board 133 in a micro manner. The electrically conducting pad 137 is placed in every pin hole 131 of the socket 132. And the solder pad 135 is on the bottom part of the pin holes 131. The pin holes 131 are extended from the bottom part of the electrically conducting pad 137 in order to form the PTH (Plated Through Hole) 121 in the main board 12 for pins 1371. The electrically conducting layer 122 is set in the PTH 121 of the main board 12 in order to connect with pins 1371 electrically. The position of the contact pad 1221 and the PTH 121 on the upper surface of the main board 12 can be SMD (solder mask defined) or NSMD (none solder mask defined). The pins 1371 and the electrical connection device 13 are soldered on the main board 12 firmly by the materials 123 and 125 of the soldering. The larger holes on the sliding pad 133 corresponding to the pin holes 13 are set. Rotating the long stick 134 along the axle 136 to be parallel with the socket 132 will make the slider 133 move in micro manner and the pins 111 in IC package 11 be hold tightly in the pin holes 131. In order to take out the IC package 11, the long stick 134 can be rotated to be horizontal with the socket 132, and then the pins 111 can be released from the IC package 11.

Please refer to FIG. 3 which is the combination device 10a of the main board and the electrical connection device of the replaceable IC package in prior art. Because the IC package 11 and the electrical connection device 13a in prior art are similar to the devices in prior art in FIG. 1, additional description of the detailed element and the structure is not necessary, but shown in dashed lines. The main difference in FIG. 3 is that the combination device 10a is using several solder balls 138 but not the pin-style structures. Instead of PTH, the solder pad 126 is placed on the main board 12a by solder reflow of the solder ball 138 of the electrical connection device 13a and the solder pad 126 of the main board 12a. We can solder on the solder pad 126 firmly for the solder balls 138. The disadvantages in prior art are the intensity of the structure of the combination of the solder balls 138 and the solder pad 126 is weaker because the solder balls 138 and the solder pad 126 combine in plane-contact style. The disadvantage will lead to the increase of the defect of the products. Or the department of the solder balls 138 from the solder pad 126 will be possible. And the stability of the electricity and the short-circuit characteristics will happen because the overflow of the solder balls 138 in the solder reflow. In the same time, the co-planarity of the combination of the electrical connection device 13a and the main board 12a will be bad.

The pin-style electrical connection device in FIG. 1 in prior art and the ball-style electrical connection device 13a in FIG. 3 in prior art will use the corresponding main board 12 and 12a. Because the main board 12a in FIG. 3 will not provide the PTH to apply the usage of the pin-style electrical connection device 13. The PTH 121 in the main board 12 can apply the usage of the pin-style electrical connection device 13. The main board 12 with PTH 121 will be in solder reflow with the ball-style electrical connection device 13a according to the ratio of the Sn/Pb being 63/37 and the Eutectic temperature of the solder balls being 183 degrees. The working temperature is changed according to the different time period. The highest working temperature is 220 degrees. We can not provide the stable connection of the electricity and the function of the soldering firmly. So we will not find the both functions of the ball-style electrical connection device 13a and the pin-style connection device 13 which are applied to the same main board.

SUMMARY OF THE INVENTION

The primary aspect of the present invention is to provide the same combination device of the main board and the IC package connection device. We can apply the combination device to combine with one of the ball-style electrical connection device and the pin-style electrical connection device.

In another aspect of the present invention is to provide the combination device of the main board and the IC package connection device. By the way of changing the ratio of the Sn/Pb in solder balls on the bottom surface of the socket of the ball-style electrical connection device, the Liquidus temperature (totally melting temperature) of the solder balls will be changed to a proper value (higher than the Eutectic temperature). Thesemi-melting state of the solder balls will not be empty in the PTH in the solder reflow of the main board with PTH and the ball-style electrical connection device. A part of the semi-meltingsolder ball will be putted in a part of the PTH in order to make the solder ball be a mushroom-shape structure after the process of solder reflow to provide the good intensity of the structure of the combination, the co-planarity and the yield of the product.

To achieve the purposes described above, one of the embodiment of the present invention comprises a socket and a main board. Said socket includes the inputted assembly on the top surface of the socket being used to connect with the IC package electrically and some solder balls. The solder balls are on the bottom surface and are corresponding to the inputted assembly of the socket. Several PTH are in the main board and the positions of the PTH are corresponding to the positions of the solder balls. The Liquidus temperature of the solder balls is higher than the Eutectic temperature of the solder balls, Sn/Pb at ratio 63/37, in prior art. The difference of the Liquidus temperature of the solder balls will make the solder balls be controllable semi-solid state and make a part of the—semi-solid state solder ball be able to input to a part of the PTH in solder reflow process. In order to let the solder balls be the mushroom-shape structure and the upper-mushroom-shape part on the main board and the lower-mushroom-shape part inputted in a part of the PTH.

The appended drawings will provide further illustration of the present invention, together with the description, serve to explain the principles of the invention.

DETAILED DESCRIPTION OF THE PRESENT INVENTION

The major object of the present invention is to change the ratio of Sn/Pb in the solder balls on the bottom surface of the ball-style electrical connection socket and is to increase the Liquidus temperature of the solder ball. The solder ball will be in controllable semi-solid state in order to avoid flowing out from the PTH to be emptied by the gravity when the main board with the PTH and the ball-style socket are in the process of solder reflow. A part of the PTH will be inputted by a part of the liquid solder material. And it will make the solder ball be a mushroom-shape structure after the process of solder reflow. The upper surface of the main board and the lower-mushroom part inputted in a part of the PTH will be formed. The structure of the combination of the solder ball of the mushroom-shape socket and the PTH of the main board will provide the better intensity of the structure of the combination. And we will make the main board with PTH be suitable in the pin-style socket and the ball-style socket.

In the following embodiments, we will describe the detailed methods, the way of the operation, the effect and the other characteristics of the present invention.

Figure 4:
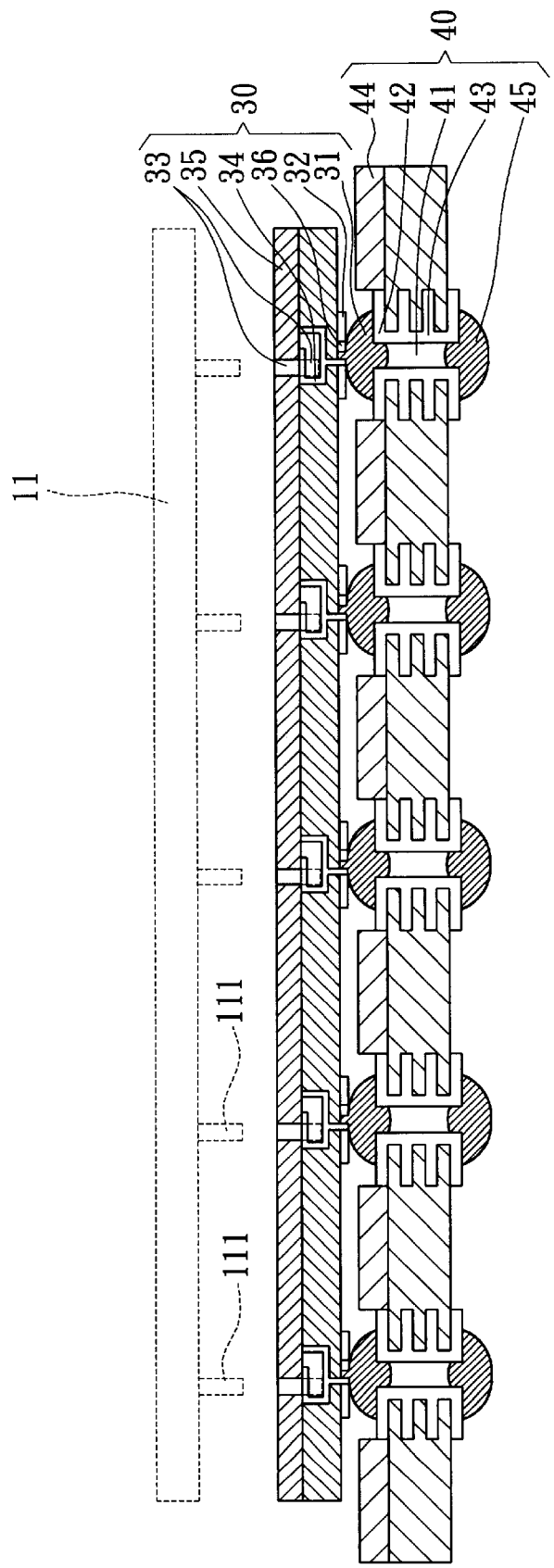
FIG. 4 shows the side view of the first embodiment of the combination device of the main board and the IC package connection device in the present invention.

Please refer to FIG. 4. It shows the side view of the first embodiment of the combination of the main board and the IC package connection device in the present invention. The IC package 11 will be connected and plugged in the combination device of the main board and the IC package connection device. The assembly of the IC package comprises an IC socket 30 and a main board 40.

And the pins 111 in the IC package 11 are not the main characteristics in the present invention. So we just show it in FIG. 4 by dashed lines.

The IC connection device 30 comprises a holding assembly and several solder balls 31. The IC connection device 30 is a ball-style socket 30. The holding assembly is placed on the top surface of the socket 30 and is used to connect the external IC device 11 electrically. The solder balls 31 are placed on the contact pad 32 of the bottom surface of the socket 30 and connect with the corresponding holding assembly electrically. The material of the contact pad 32 can be NI, Au, Cu, chromium, Fe, Al, Ti, lead, Sn or the alloy.

Figure 1:
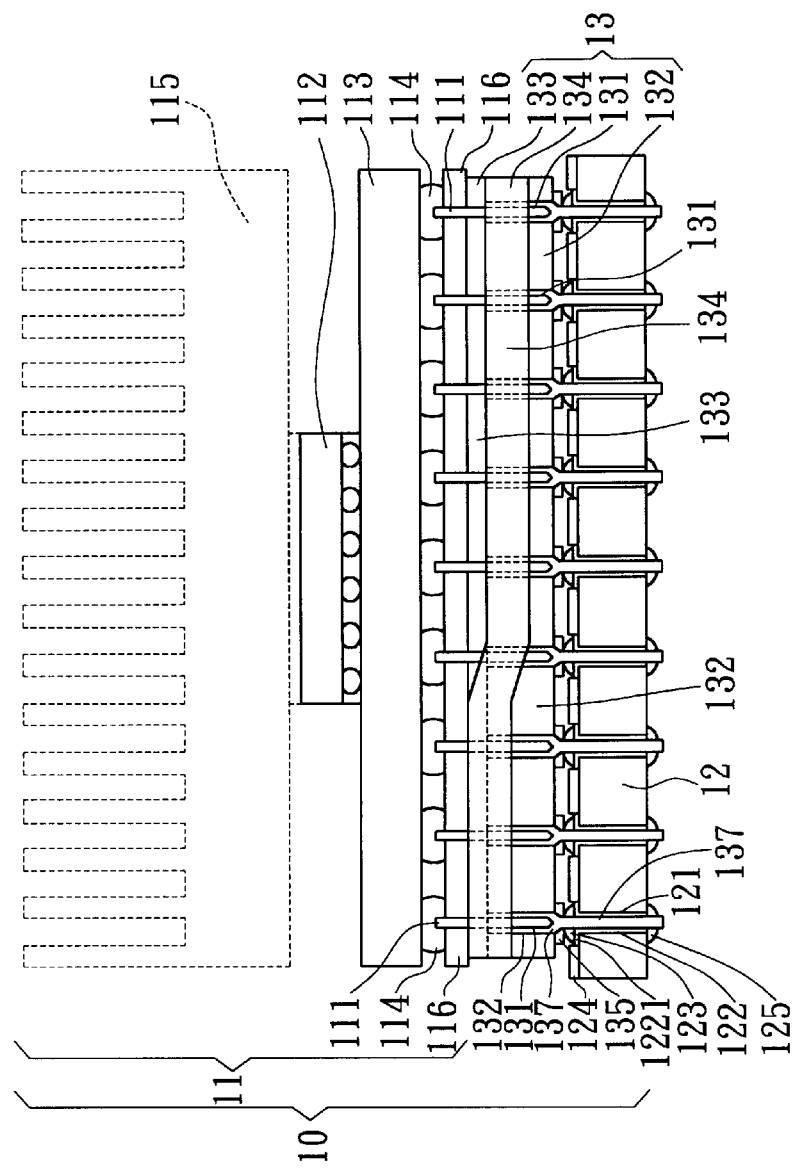
FIG. 1 shows the side view of the combination device of the main board, the pin-style electrical connection device and the IC package device in prior art.
Figure 2:
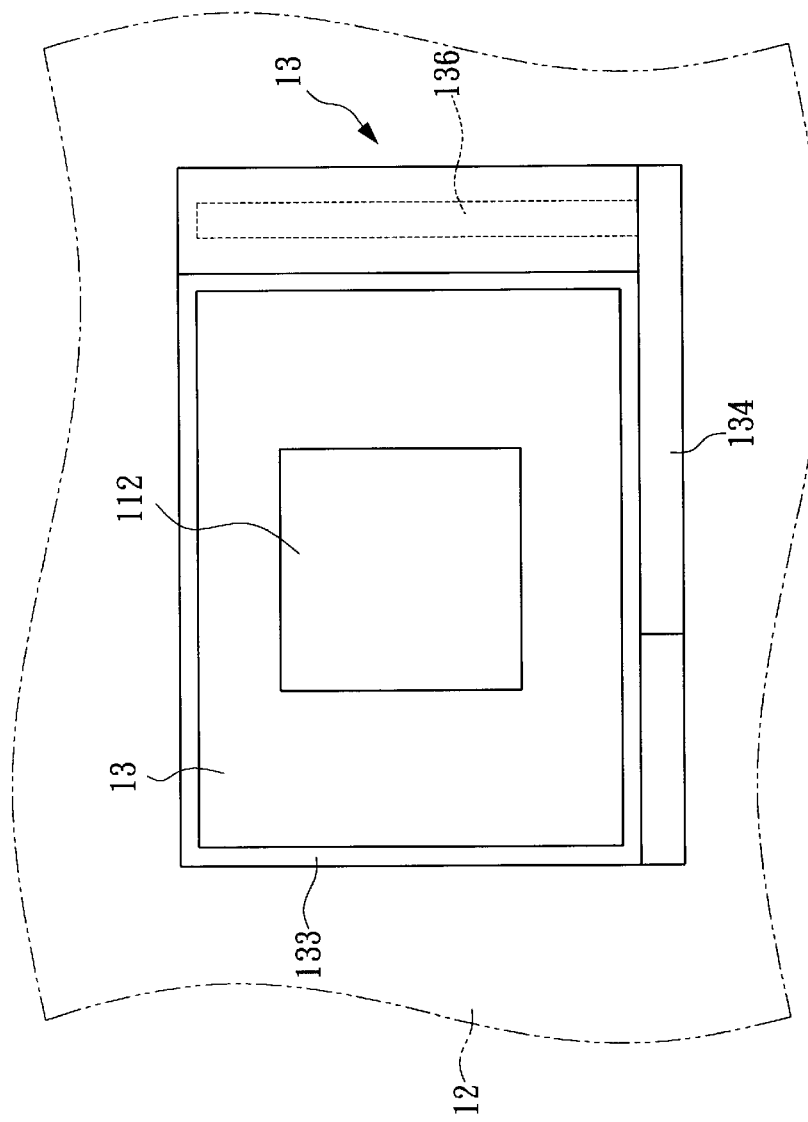
FIG. 2 shows the top view of the combination device of the main board, the pin-style electrical connection device and the IC package device in FIG. 1 in prior art.
Figure 3:
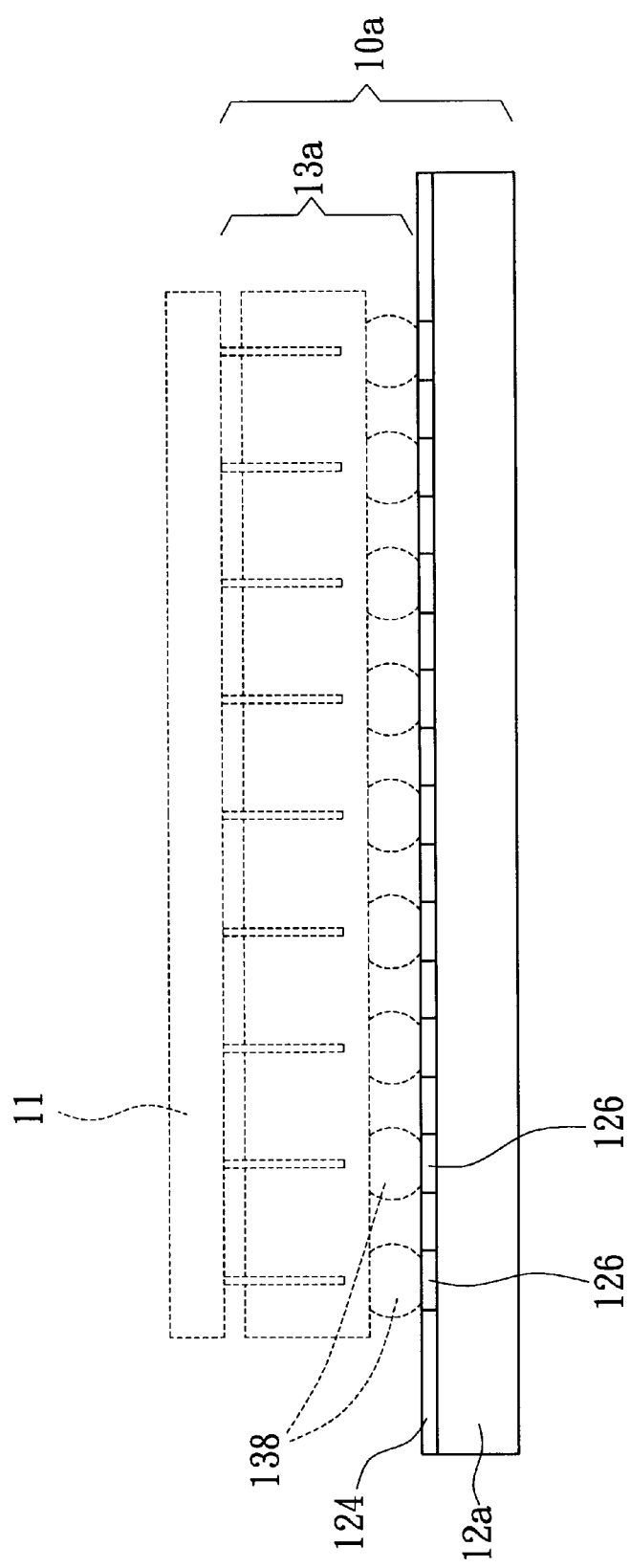
FIG. 3 shows the side view of the combination device of the main board, the ball-style electrical connection device and the IC package device in prior art.

The holding assembly of the socket 30 comprises the following elements: (a) several pin holes 33 (b) several electrically conducting elements 34 (c) a slide cover mechanism 35. The pin holes 33 placed on the top surface of the socket can be plugged in by the external pin-style IC package 11. And we can remove the IC package 11 if necessary. The electrically conducting element 34 is corresponding the pin hole 33 and contacts the corresponding solder ball 31 directly. And in the same time the electrically conducting element 34 can contact the pins 111 of the IC package 11. The spring contact pad 36 on the bottom end of the electrically conducting element 34 will provide the function of the electrical connection in the process of soldering the solder balls 31 on the main board 40 in the embodiment. The slide cover mechanism 35 is placed on the top surface of the socket by sliding. In order to hold the IC package 11 on the socket 30, we will slide the slide cover mechanism 35 in limited distance when the external pin-style IC package 11 is plugged in the pin hole 33 of the socket 30. Because the slide cover mechanism 35 is similar to the structure of the slide cover mechanism 35 in FIG. 1 and is not the major characteristics of the present invention, so the detail description thereof is not necessary here.

The solder balls are composed of Pb/Sn, Sn/Cu, Sn/Cu/Ag, Bi/Ti, Au/Sn or other compositions in prior art. For the Pb/Sn solder ball, the ratio of Sn is between 5 percent to 95 percent and Pb is between 95 percent to 5 percent. The better ratio of Sn/Pb of the solder balls 31 will be between 60/40 and 75/25 in the present invention. In prior art, the totally melting temperature of the solder ball is 183 degrees which is the Eutectic point of Sn/Pb at ratio 63/37. However, in the present invention, the ratio is between 60/40 and 75/25, which will change the totally melting temperature (i.e. Liquidus temperature) of the solder balls 31 to between 190 degrees and 195 degrees. In other embodiments of the present invention, we can mix other metals (such as Ag or Sb) in the solder balls 31 to change the Liquidus temperature.

The socket 30 is combined with the upper surface of the main board 40 and connects to the main board 40 electrically. The main board 40 comprises several PTH 41. The position of the PTH 41 is corresponding to the solder ball 31. The solder pad on the upper side of the PTH 41 is formed in order to connect the solder ball 31 of the socket 30. The electrically conducting layer 43 is placed in the inner surface of each PTH 41. The SMD (or NSMD) 44 is distributed on the upper surface of the main board 40. The position of the PTH 41 is defined by SMD 44. And the solder pad 42 of every PTH 41 is not covered by SMD 44 and is on the outer surface of the main board 40 to combine the solder balls 31 of the socket 30.

The socket 30 is departed from the main board 40 and the solder balls 31 is the spherical before the solder reflow applying to the socket 30 and the main board 40. Many other devices (such as resistor, capacitor or other components not shown in the drawing) and the socket of the main board 40 are will be in the same solder reflow process. So, the Melting point in the process can not be changed flexibly but has to be limited around 220 degrees. In present invention, the Liquidus temperature of the solder balls 31 will be maintained higher than 190 degrees, so the hardness of the solder balls 31 will be controlled and not totally flow away from PTH due to gravity. Only a part of the solder balls 31 will flow into the part of the upper PTH 41 to make the solder balls 31 form the mushroom-shape structure shown in FIG. 4. The upper-mushroom part on the top surface of the main board and a part of the lower-mushroom part in PTH 41 will be formed and the lower-mushroom part will contact the inner surface of PTH 41.

The mushroom-shape structure of the socket 30 and the main board 40 can make the main board 40 which having PTH 41 combine the ball-style electrical connection socket 30. And the solder balls 31 will not totally flow away from the PTH 41. Because the solder balls 31 will form the mushroom-shape structure in the process of solder reflow, a part of the lower-mushroom part in PTH 41 will combine the PTH 41 of the main board 40 tightly. The contacting area will be increased and the intensity of the structure of the combination will be better. The stability of the electrical connection will be better. The material of the solder ball will flow into the PTH when the material of the solder ball is too much. In the present invention, the co-planarity of the combination between the main board 40 having PTH 41 and the ball-style electrical connecting socket 30 will be better. The yield of the product will be improved.

The several solder ball 45 will be placed in the positions of the bottom side of the main board corresponding to every PTH. The solder balls 45 will form the upside down mushroom-shape structure after the solder reflow process. And the mushroom-shape structure will comprises the upper-mushroom structure on the bottom surface of the main board 40 and the lower-mushroom part in the bottom part of PTH 41. The lower-mushroom part of the solder ball 45 and the lower-mushroom part of the solder balls 31 will not contact each other in the embodiment. In another embodiment, the lower-mushroom part of the solder balls 45 will contact the lower-mushroom part of the solder balls 31.

In the following embodiments, the same name and the same number will be used for the same devices as in the previous embodiments. For some similar devices, an English letter will be added for distinguishing purpose.

Figure 5:
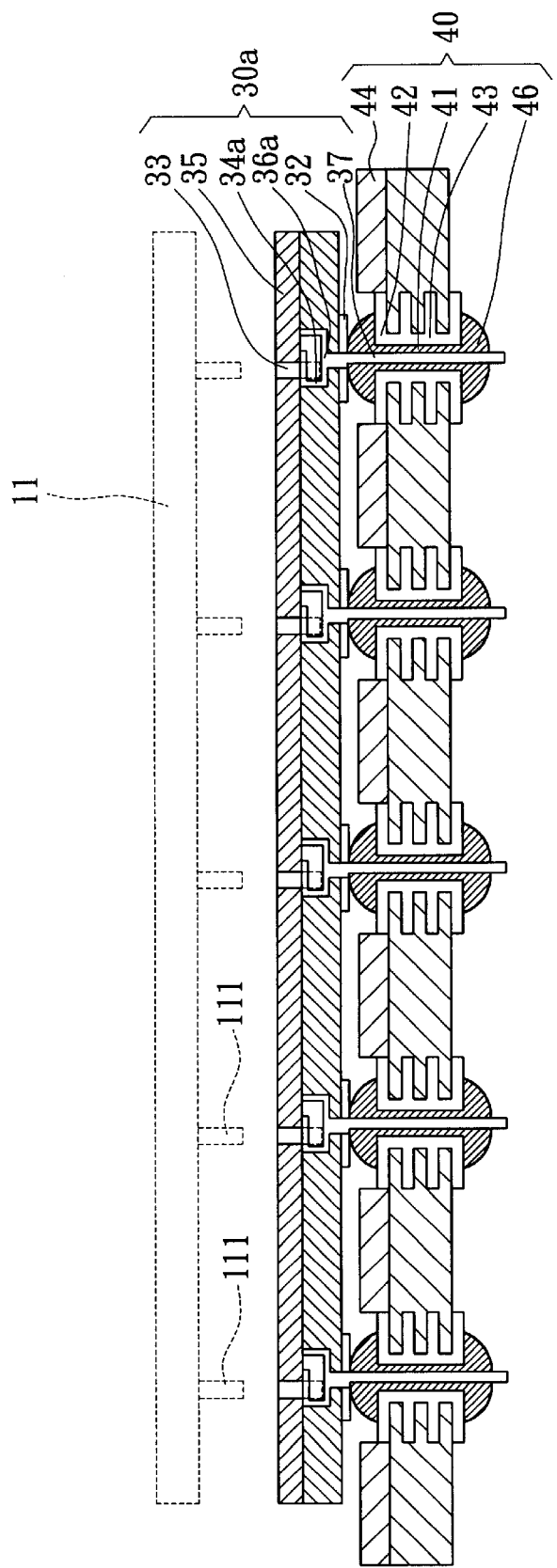
FIG. 5 shows the side view of the second embodiment of the combination device of the main board and the IC package connection device in the present invention.

Please refer to FIG. 5. The schematic shows the side view of the second preferred embodiment of the combination of the main board and the IC package connection device. The solder ball will not be placed on the bottom surface of the electrical connection socket 30a in FIG. 5. The pin-style part 37 will be extended from the bottom part of the electrical conducting element 34a to form the pin-style electrical connection socket 30a. The material of the solder ball 46 is Sn/Pb and the ratio thereof is 63/37. The material of the solder ball 46 will fulfill in the PTH 41 of the main board. The main board 40 in FIG. 5 in the present invention can combine the ball-style electrical connection socket 30 and can combine the pin-style electrical connection socket 30a.

Figure 6:
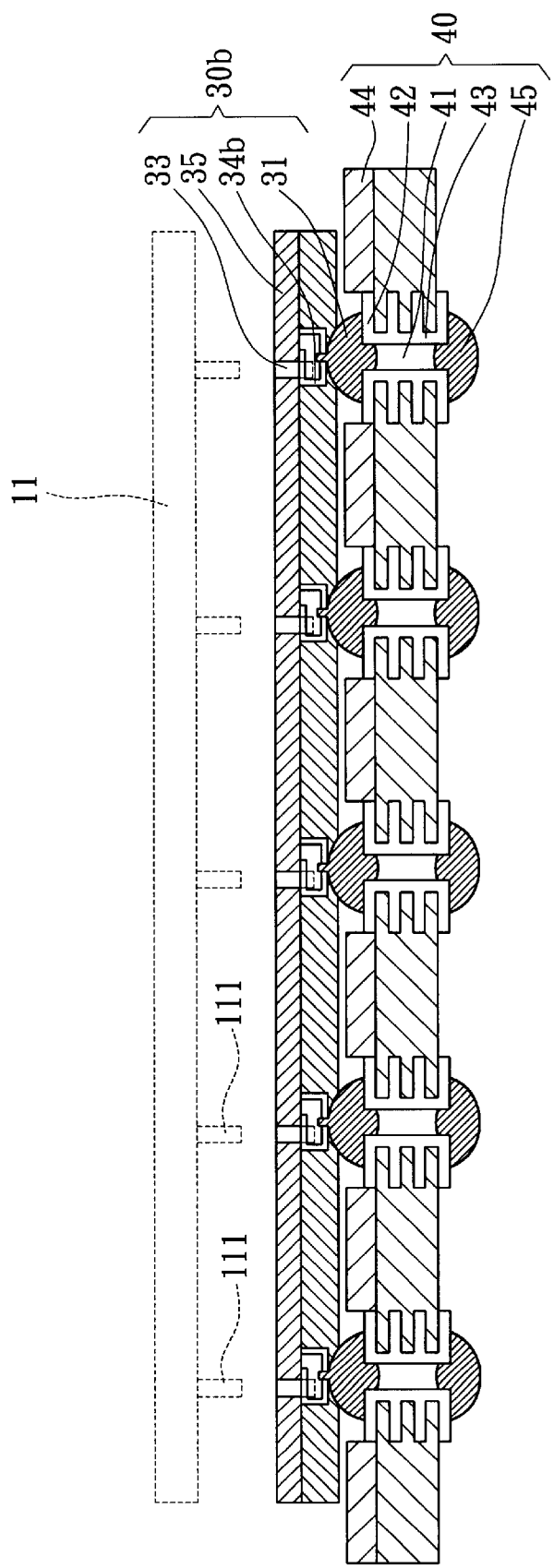
FIG. 6 shows the side view of the third embodiment of the combination device of the main board and the IC package connection device in the present invention.

Please refer to FIG. 6. The third preferred embodiment of the combination device of the main board and the IC package connection device in the present invention exists. The bottom part of the socket 30b in FIG. 6 will not be placed the contact pad but to form the several curve-shape concave in order to define the positions for the solder balls 31. And in the same time a small hole will be set in the spring contact pad of the electrically conducting element 34b. the intensity of the combination of the solder balls 31 and the socket 30b will be improved in solder reflow when partial material of solder ball of the solder balls 31 flowing in the small hole.

Figure 7:
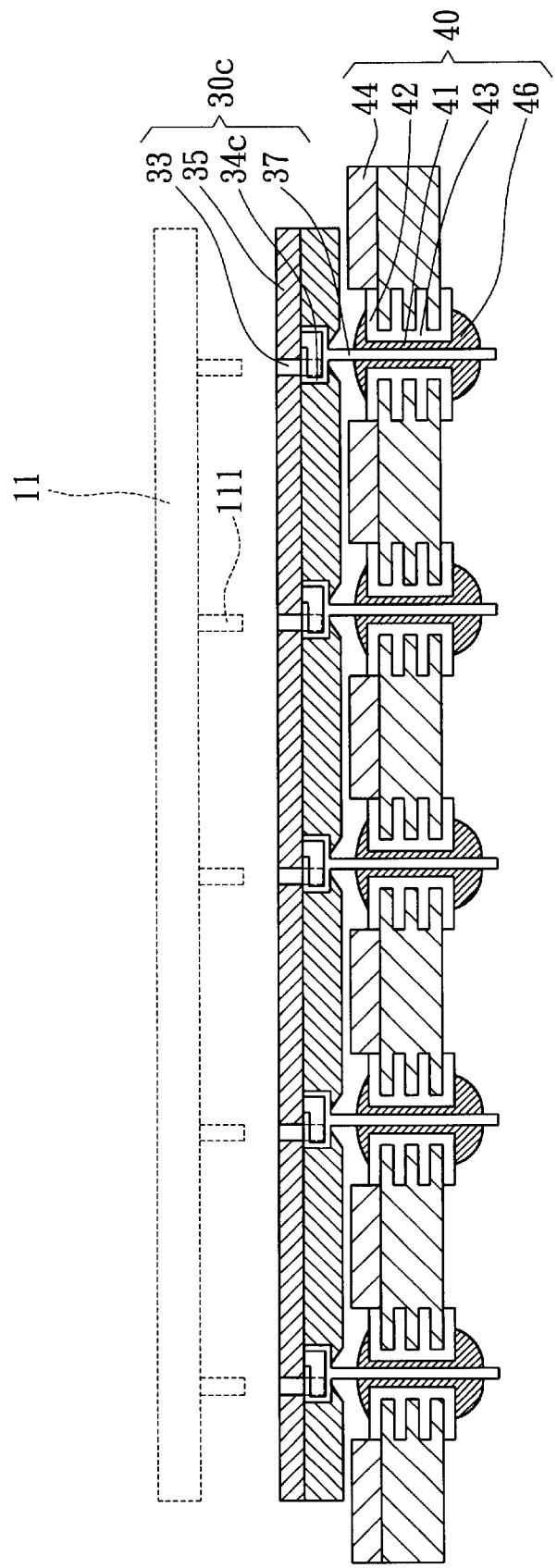
FIG. 7 shows the side view of the fourth embodiment of the combination device of the main board and the IC package connection device in the present invention.

Please refer to FIG. 7. The fourth preferred embodiment of the combination device of the main board and the IC package connection device in the present invention is shown in FIG. 7. The several slant concaves are formed on the bottom part of the socket 30c without contact pad.

Comparing with prior art, the combination device of the main board and the IC package connection device and the replaceable methods in the present invention have the following advantages: (1) The single main board 40 having PTH 41 is suitable for the several kinds of the different sockets 30, 30a, 30b and 30c. The cost is lower and the design will be flexible. (2) In the combination structure of the main board 40 having PTH 41 and the ball-style socket 30 and 30b with the solder balls in FIG. 4 and FIG. 6, the lower-mushroom part of the mushroom-shape solder balls 31 flows and inserts into partial upper part of the PTH 41 of the main board 40. The characteristics will improve the intensity of the structure of the device and the co-planarity of the socket 30b and the main board 40.

While the present invention has been shown and described with reference to a preferred embodiment thereof, and in terms of the illustrative drawings, it should be not considered as limited thereby. Various possible modification, omission and alterations could be conceived of by one skilled in the art to the form and the content of any particular embodiment, without departing from the scope and the spirit of the present invention.

What is claimed is:

1. A combination device of an IC package connection device and a main board comprising:
   a socket comprising:
      a holding assembly being placed on the top surface of the socket and connecting an external pin-style IC package device;
   a plurality of first solder balls being placed on the bottom surface of the socket and electrically connected to the holding assembly;
   a main board having top surface on which the socket is electrically connected, the main board comprising:
      a plurality of PTHs whose positions correspond to the plurality of the first solder balls wherein each of the plurality of first solder balls has a mushroom-shape structure with an upper-mushroom part positioned between the socket and the main board and a lower-mushroom part positioned inside one of the PTHs;

wherein the holding assembly of the socket comprises a plurality of pin holes respectively receiving a pin of the external pin-style IC package device a plurality of electrically conducting elements being positioned in the pin holes respectively and electrically connectable to the pin-style IC package; and wherein the plurality of first solder balls are electrically connected to respective ones of the plurality of the electrically conducting elements.

2. The combination device of an IC package connection device and a main board of claim 1, wherein the holding assembly of the socket comprises:

a slide cover mechanism positioned on the top surface of the socket in sliding manner, such that when a pin-style IC package being plugged in the pin holes, the slide cover mechanism moles in a limited distance to hold the IC package on the socket firmly.

3. The combination device of an IC package connection device and a main board of claim 1, wherein an electrically conducting layer is set in the inner surface of each PTH to provide the electrical connection to the lower-mushroom part of the first plutality of solder balls.

4. The combination device of an IC package connection device and a main board of claim 1, wherein a plurality of second solder balls are positioned on the bottom surface of the main board in the corresponding respective positions of the PTHs, with each of the second solder balls having a shape that is the inverse of the mushroom-shape structure, and having an upper-mushroom part on the bottom surface of the main board, and a lower-mushroom part flowing into a part of the PTH.

5. The combination device of an IC package connection device and a main board of claim 4, wherein the second solder balls will not contact the corresponding first solder balls directly.

6. The combination device of an IC package connection device and a main board of claim 4, wherein the lower mushroom parts of the second solder balls contact the corresponding lower-mushroom parts of the first solder balls respectively.

7. The combination device of the IC package connection device and the main board of claim 4, wherein the first and second solder balls are composed of the alloy of Pb and Sn, in which the ratio of Sn is between 60 percent and 75 percent, and the ratio of Pb is between 40 percent and 25 percent.

8. The combination device of an IC package connection device and a main board of claim 1, wherein a solder mask is distributed on the top surface of the main board to define the positions of the PTHs to make the PTHs be uncovered by the solder mask.

9. The combination device of the IC package connection device and the main board of claim 1, wherein the first and second solder balls are composed of the alloy of Pb and Sn, in which the ratio of Sn is between 60 percent and 75 percent, and the ratio of Pb is between 40 percent and 25 percent.

10. The combination device of an IC package connection device and a main board of claim 1, wherein at least one external electronic device is placed on the main board.

* * * * *